United States Patent [19]
Naumenko et al.

[11] Patent Number: 5,917,265
[45] Date of Patent: Jun. 29, 1999

[54] OPTIMAL CUT FOR SAW DEVICES ON LANGASITE

[75] Inventors: Natalya F. Naumenko; Victor S. Orlov, both of Moscow, Russian Federation

[73] Assignee: Sawtek Inc., Orlando, Fla.

[21] Appl. No.: 08/870,524

[22] Filed: Jun. 6, 1997

Related U.S. Application Data

[63] Continuation-in-part of application No. PCT/US96/17906, Dec. 20, 1996.

[30] Foreign Application Priority Data

Jan. 10, 1996 [RU] Russian Federation ............. 96100012

[51] Int. Cl.$^6$ .................................................. H01L 41/08
[52] U.S. Cl. ......................................................... 310/313 A
[58] Field of Search ................................ 310/313 A, 360

[56] References Cited

U.S. PATENT DOCUMENTS

| | | |
|---|---|---|
| 4,672,255 | 6/1987 | Suzuki et al. |
| 5,821,673 | 10/1998 | Pisarevsky et al. ................. 310/360 |

OTHER PUBLICATIONS

"Optimal Cuts of Langasite for SAW Devices", N.F. Naumenko, Materials of Conference—"Acoustoelectronic STW Devices for Signal Processing", Sep. 6–8, 1990, Cherkassy (USSR), pp. 18–19 (Translation of attached Russian excerpt).

"Numerical Data and Plots into Depth", A.J. Slobodnik, Jr., E.D. Conway, Microwave Acoustics Handbook—vol. 1. Surface Wave Velocities, Office of Aerospace Research, United States Air Force, Microwave Physics Laboratory—Project 5635, Air Force Cambridge Research Laboratories, L.G. Hanscom Field, Bedford, Massachusetts, Physical Sciences Research Papers, No. 414, Mar. 1970, pp. 83 & 85.

"Langasite ($La_3Ga_5SiO_{14}$)—An Optical Piezoelectric: growth and Properties:", M.F. Dubovik, I.A. Andreyev, Yu.S. Shmaly, Institute for Single Crystals of Academic Science of Ukraine, Kharkov, 1994 IEEE International Frequency Control Symposium, pp. 43, 45–47.

"Quasilongitudinal Pseudosurface Acoustic Waves in Trigonal Crystals", A.I. Kozlov, Institute of Radioengineering and Electronics of Russian Academy of Sciences, Moscow, 1995 IEEE Ultrasonics Symposium, pp. 197–200.

patent abstract. EP 866551. Inui et al, Sep. 1998.
patent abstract. JP 10126209, May 1998.
patent abstract. EP 874455. Inoue et al, Oct. 1998.
patent abstract. JP 09069620. Kan et al, Jul. 1998.
patent abstract. JP 08274589. Komatsu et al, May 1998.
patent abstract. EP 865156. Imanishi et al, Sep. 1998.
patent abstract. DE 19532606. Ruppel et al, Apr. 1997.

*Primary Examiner*—Nestor Ramirez
*Assistant Examiner*—Peter Medley
*Attorney, Agent, or Firm*—Allen, Dyer, Doppelt, Milbrath & Gilchrist, P.A.

[57] ABSTRACT

A lanthanum gallium silicate single crystal substrate, referred to as langasite, has a prescribed range of Euler angles for substrate and crystal orientation for improving signal processing for a surface acoustic wave (SAW) device. When a voltage is applied to an input interdigital transducer (IDT) of the SAW device, a surface acoustic wave is generated in the langasite piezoelectric substrate. The surface acoustic wave propagates in a direction generally perpendicular to electrodes of the IDT. The langasite crystal cut and wave propagation directions are defined which reduce insertion loss due to SAW transduction, diffraction, and beam steering. As a result, temperature stability for the SAW device is improved. A low power flow angle and reduced level of diffraction is also achieved.

13 Claims, 3 Drawing Sheets

OPTIMAL CUT FOR SAW DEVICES ON LANGASITE

CROSS-REFERENCE TO RELATED APPLICATIONS

This application is a continuation-in-part of co-pending International Application No. PCT/US96/17906, filed Dec. 20, 1996, claiming priority to Russian application No. 96-100012/09, filed Jan. 10, 1996, commonly owned with the present invention.

FIELD OF THE INVENTION

The invention relates to a surface acoustic wave (SAW) device and, more particularly, to a device having a langasite crystal substrate with a predetermined crystalline orientation for causing a surface acoustic wave to propagate along a predetermined crystalline axis of the substrate.

Background of the Invention

This invention relates to an optimal surface acoustic wave orientation on single crystal lanthanum gallium silicate or $La_3 Ga_5 Si O_{14}$, commonly known as langasite (LSG). SAW devices are currently used as bandpass filters, resonators, delay lines, convolvers, etc. in a broad range of RF and IF applications such as wireless, cellular communication and cable TV. Three commonly used substrates are lithium niobate, ST-Quartz, and lithium tantalate. There are several material properties that determine the usefulness of any particular crystal and, in particular, orientation of a particular crystal. These properties include: 1) SAW velocity, Vs; 2) the SAW piezoelectric coupling coefficient, $k^2$; 3) the power flow angle, PFA; 4) the diffraction or beam spreading coefficient, $\gamma$ (gamma); and 5) the temperature coefficient of delay, TCD. It has not been possible to find an orientation in any existing substrate which optimizes these properties at the same time; so the choice of substrate and orientation depends upon what is important for the application, and almost always involves a compromise between the SAW material properties. A high velocity is desirable for high frequency devices, because the device geometry patterns are larger and, therefore, the devices are easier to fabricate. At low frequencies, a low velocity is usually desirable because the device size is smaller, resulting in lower devices and packaging costs. Thus, there is no universally optimum velocity. For moderate to wide bandwidth devices, a high value of $k^2$ is desirable because it allows lower insertion loss. From the point of view of $k^2$, lithium niobate is best, quartz is worst, and lithium tantalate is in between. For most devices, and in particular narrow band devices, TCD should be as low as possible and ideally zero. From this point of view, ST-Quartz is best, lithium niobate is worst, and lithium tantalate is in between (just the opposite ranking as for $k^2$). The optimum value of $\gamma$ is $-1$, which results in minimum beam spreading. From this point of view, YZ lithium niobate is now ideal, ST-Quartz is worst, and lithium tantalate is in between. The PFA should be zero, and this is the case for most of the commonly used SAW substrates, with an exception being 112° lithium tantalate, which has a PFA of 1.55°. For the most narrow band applications, ST-Quartz is a quite acceptable choice; and for the very wide band applications where temperature stability is not so important (e.g., a device can be held at constant temperatures), lithium niobate is usually quite acceptable. What is needed is a substrate orientation that offers the temperature stability of ST-Quartz but with higher $k^2$ and at the same time low or zero beam steering (PFA) and diffraction ($\gamma=-1$). It is an object of the present invention to provide a substrate that meets these conditions.

Earlier research looked at using langasite to achieve a favorable trade-off in the material properties that determine the coupling, PFA, diffraction, and TCD. The choice of Euler angles were as follows: $\phi=90°$, $\theta=10°$, and $\psi=0°$. The performance parameters of this orientation were quite poor. The TCD is 12 ppm/° C. (ST-Quartz is near zero), the coupling $k^2=0.26\%$ (better than ST-Quartz, which is 0.11%), PFA=$-5.7°$ (ST-Quartz is zero), and diffraction coefficient $\gamma=-2.86$ (also worse than ST-Quartz). Only the coupling is better than ST-Quartz.

A different orientation of langasite has been formed which has far superior properties to both ST-Quartz and the earlier orientation of langasite.

SUMMARY OF THE INVENTION

It is the object of the present invention to provide a langasite crystal having a substantially planar surface defined by the Euler angles, such that SAW propagation within this range of angles on langasite is characterized by piezoelectric coupling about two to three times stronger than typically found with ST-Quartz, by way of example, near zero PFA, near zero TCD, and near minimum beam spreading. While the latter three conditions are not all met exactly for any orientation, the performance as measured just by these three conditions together is significantly better than any known cut of $Li Nb O_3$, $Li Ta O_3$, or quartz, and choices within this range can be chosen to favor one or two at the slight expense of the third.

One preferred embodiment of the present invention includes a device which contains a langasite substrate on the surface of which input and output IDT's are placed.

This purpose is achieved as follows: the surface of the langasite substrate is perpendicular to axis Z', electrodes of IDT's are perpendicular to axis X' and are parallel to axis Y'. Axes X', Y', Z' are defined by Euler angles with respect to crystal axes X, Y, Z of langasite. Angle $\phi$ is in the range $-15°$ to 10°; angle $\theta$ in the range of 120° to 165°; and angle $\psi$ in the range of 20° to 45°.

DESCRIPTION OF THE PREFERRED EMBODIMENT

Figure 1:
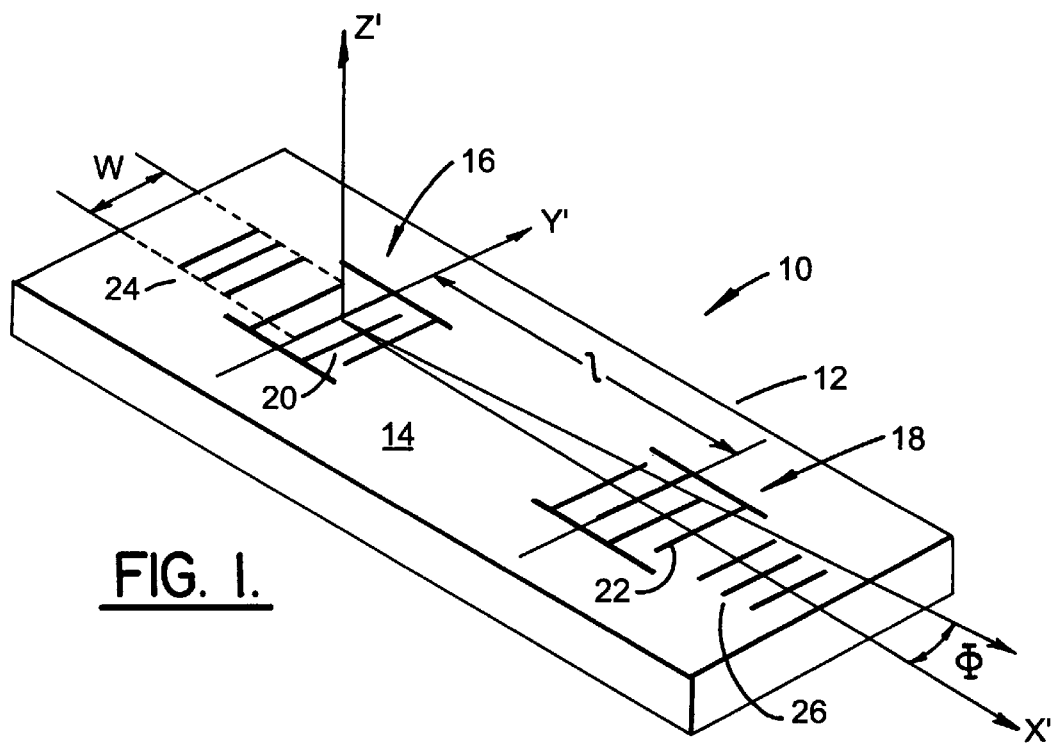
FIG. 1 is a perspective view of a SAW device illustrating interdigital transducers located on a langasite substrate surface, and a power flow angle $\Phi$.
Figure 3A:
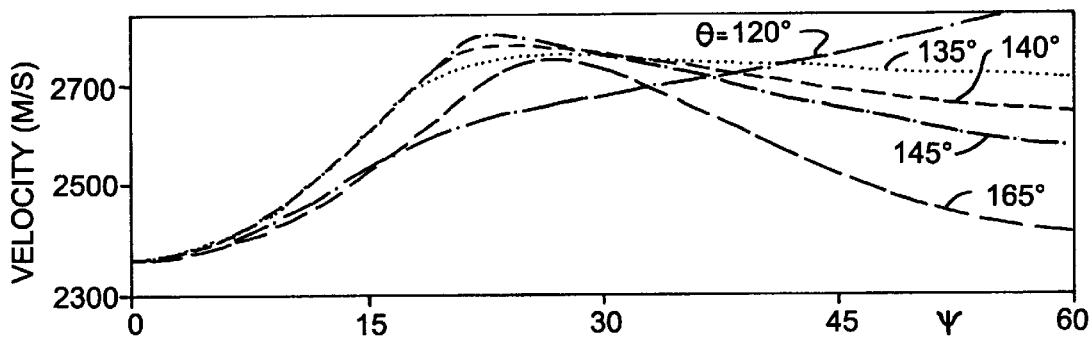
FIGS. 3A–3D illustrates SAW parameters (Velocity, Power Flow Angle, Electromechanical Coupling Coefficient, and Temperature Coefficient) versus propagation angle $\psi$ for different values of $\theta$.
Figure 3B:
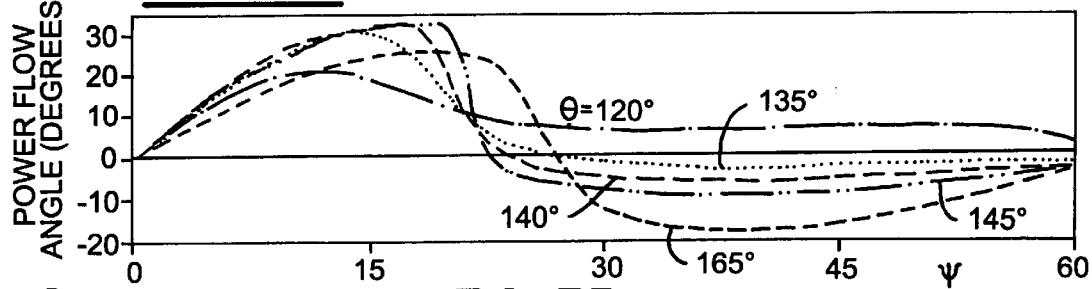
Figure 3C:
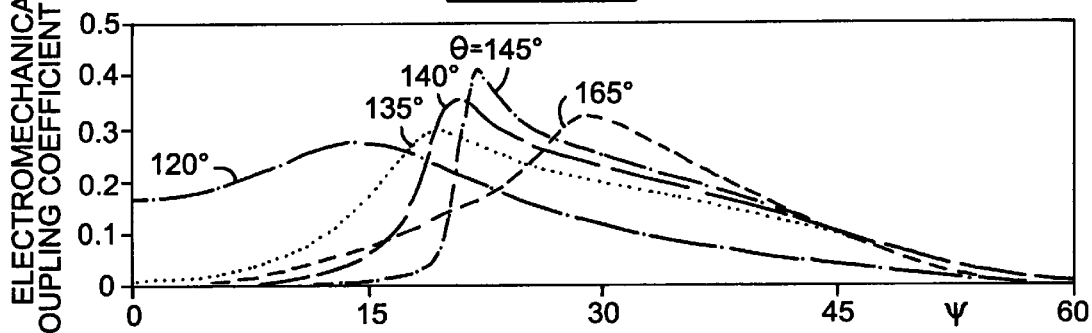
Figure 3D:
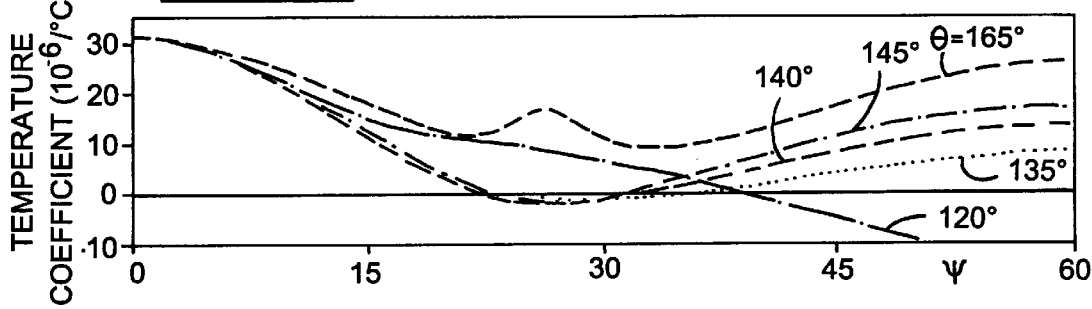
Figure 4A:
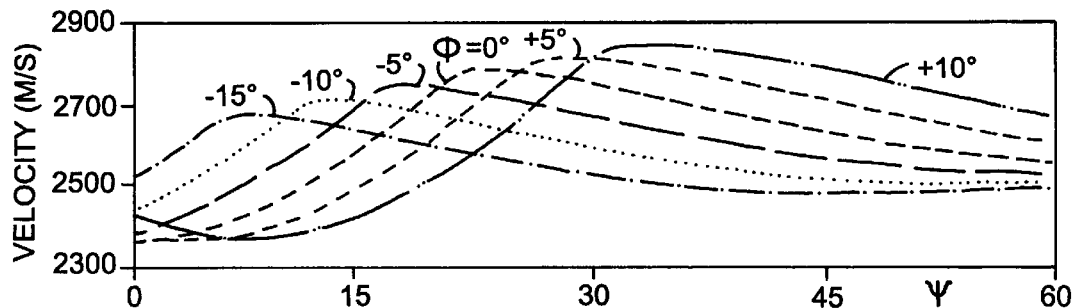
FIG. 4A–4D illustrates SAW parameters of FIG. 3A–3D versus $\psi$ for $\theta=145°$ for different values of $\phi$.
Figure 4B:
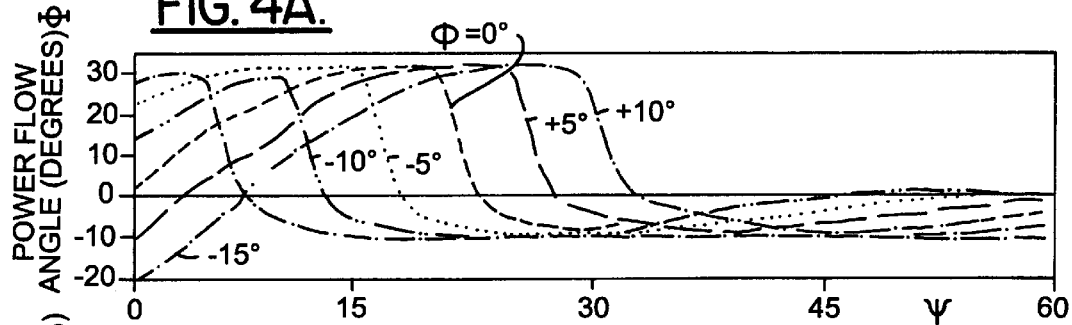
Figure 4C:
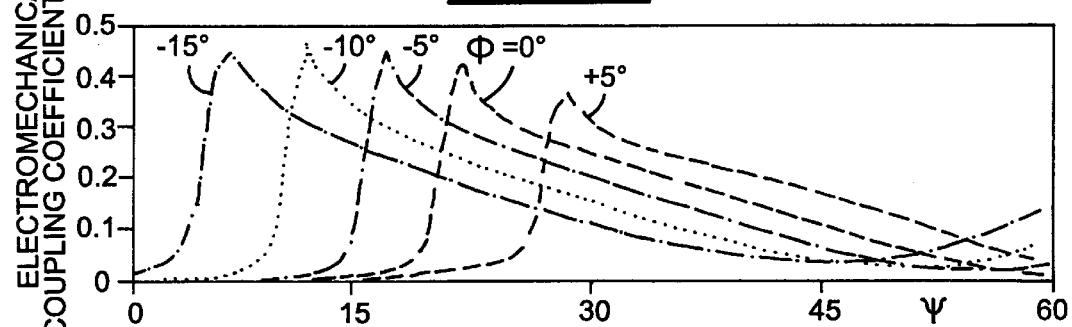
Figure 4D:
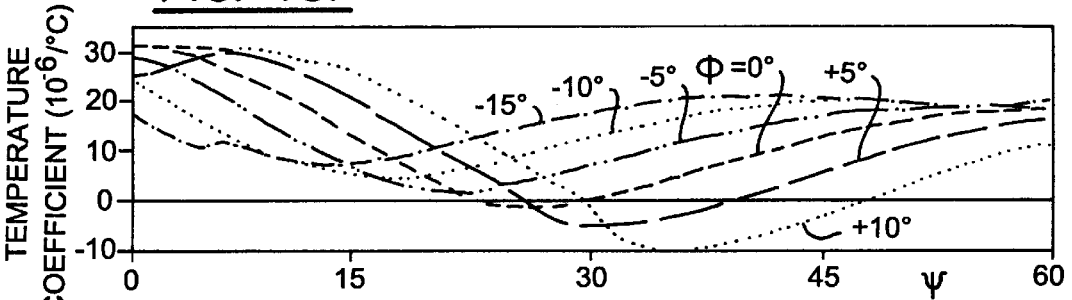

As illustrated, by way of example with reference to FIG. 1, one preferred embodiment of the present invention includes a SAW device 10 which contains a langasite substrate 12 on the surface 14 of which an input interdigital transducer and an output interdigital transducer (IDT) are placed.

Figure 2:
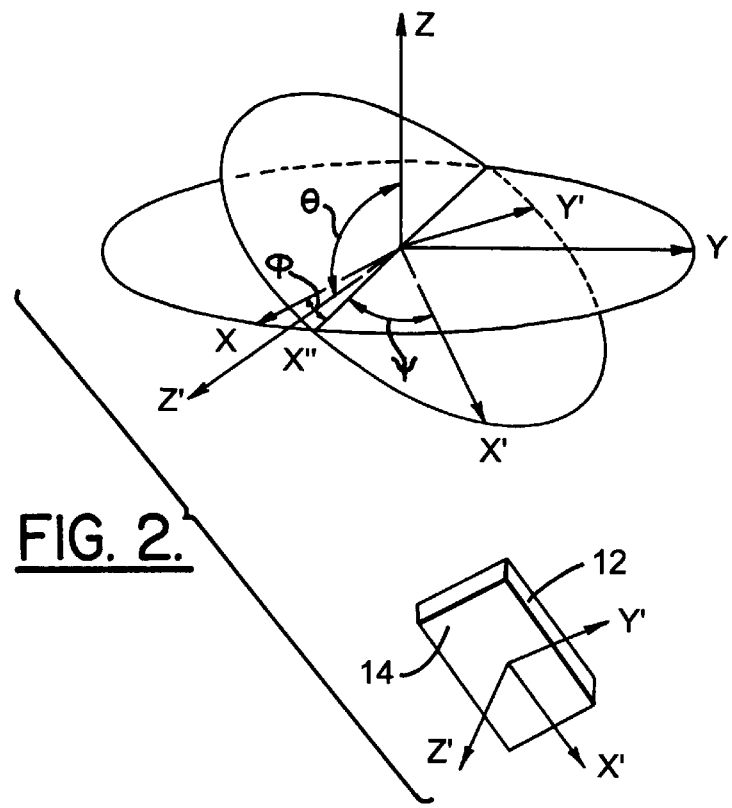
FIG. 2 diagrammatically illustrates substrate axes X', Y', and Z' and crystal axes X, Y, and Z along with Euler angles $\phi$, $\theta$, $\psi$ describing relative orientation of X,Y, and Z to X', Y', and Z', wherein X' is defined as a direction of SAW propagation.

The surface 14 of the langasite substrate 12 is perpendicular to axis Z', electrodes 20, 22 of IDT's 16, 18 respectively, are perpendicular to axis X' and are parallel to axis Y'. As illustrated with reference to FIG. 2, axes X', Y' and Z' are defined by Euler angles with respect to crystal axes X, Y and Z of the langasite substrate 12. For the preferred embodiment of the present invention, angle $\phi$ is in the range $-15°$ to $10°$; angle $\theta$ in the range of $120°$ to $165°$; and angle $\psi$ in the range of $20°$ to $45°$.

The crystal cut of langasite with Euler angles $\phi=-1.8°\pm10°$, $\theta=135.6°\pm10°$, and $\psi=24.1°\pm10°$, provide improved performance for SAW devices. Specifically, the crystal cut provides a near simultaneous optimization of three critical SAW propagation parameters and a favorably value of a fourth parameter. This fourth parameter is the coupling constant $k^2$, which varies between 0.25% and 0.35% as compared to 0.12% for ST-Quartz crystal. The three SAW propagation parameters are the PFA, $\gamma$ and TCD, which, as earlier described, are the power flow angle, the diffraction coefficient, and the temperature coefficient of delay, respectively. PFA is also known as $\Phi$, the beam steering angle, and is the angle between the SAW wave vector, which is normal to the tap electrodes, and the direction of the power flow, as illustrated again with reference to FIG. 1. Ideally, the PFA would be zero. $\gamma$ is a measure of the diffraction or beam spreading. Normally, as a SAW propagates on a substrate, the beam profile will change and broaden. This beam spread causes diffraction loss and distortion to the filter response. For isotropic materials, the value of $\gamma$ is zero, and diffraction is a moderately serious problem. Diffraction is minimized when $\gamma=-1$, and this is the case for YZ Li Nb $O_3$ and a special MDC (minimum diffraction cut) of Li Ta $O_3$. For ST-Quartz, $\gamma=+0.38$, and diffraction is worse than the isotropic case. There is a range of angles within the designated range of this disclosure for which $\gamma=-1$, which is ideal. Likewise there is a range of angles for which the TCD is zero. (TCD is the relative change in delay per degree centigrade.) The desired parameter values are obtained for each parameter within the restricted range of angles of this disclosure; but since the angles associated with the values form a locus of points in a two-dimensional angle space (over $\theta$ and $\psi$), it is very difficult to find a point at which the three loci intersect. That means it is possible to achieve a desired performance in two of the three parameters and nearly ideal performances for all three parameters. Therefore, within this range, the optimal choice of angles would still be dependent upon the application, and in fact are intermediate points that minimize the problem of all three parameters. This is the reason for the spread of angles disclosed herein.

The Euler angle convention used is as described by Slobodnik et al. in "Microwave Acoustic Handbook," Vol. 1, *Surface Wave Velocities*, AFCRL-70-0164, March 1970, Physical Sciences Research Papers, No. 414, Office of Aerospace Research, USAF.

Consider a semiconductor wafer outline on a surface normal to the axis Z'. Now construct a flat plane along one edge of the wafer which is normal to the axis X'. The direction of SAW propagation is parallel to axis X'. Now assume that the crystal axes X, Y, Z are coincident with the wafer outline axes X', Y', Z', respectively. With no rotation, the wafer is considered a Z cut (the wafer is cut with the polished surface normal to Z) and X propagating (the SAW propagates in a direction parallel to the X axis). With any subsequent rotation, the wafer axes X', Y', Z' are rotated, and the crystal axes X, Y, Z are assumed to be fixed. Now, by way of example, consider the Euler angles $(\phi, \theta, \psi)=(0°, 135°, 28°)$, which is a case near the middle of the designated range. The first rotation would rotate around Z' (X' toward Y') by $\phi$. Since $\phi=0°$, there is no rotation for this case. The next rotation is around the "new" X' (the "new" axes are always tied to the wafer so that any rotation is around a wafer axis that includes all previous rotations) by $\theta$ (which is $135°$) (Y' toward Z' for a positive angle rotation). Finally, rotate around Z' (X' toward Y') by $\psi$, which for the case herein described is $28°$.

By way of further example with regard to an orientation procedure for defining a substrate (also referred to as a wafer) using Euler angles, begin with axes X, Y, Z as the crystal axes (also referred to as a boule axes) coincident with the substrate axes X', Y', Z'. The relationship between X, Y, Z and X', Y', Z' is independent of the overall orientation of its combined system in space. In preparation for cutting the crystal, and as viewed from the positive Z' axis (now coincident with the positive Z axis), first rotate the substrate $\phi°$ counterclockwise around its axis Z'. Second, as viewed from the positive X' axis, rotate the substrate counterclockwise by $\theta°$ about the substrate axis X'. Next, as viewed from the positive Z' substrate axis, rotate the substrate counterclockwise by $\psi°$ about the substrate axis Z'. The crystal is now prepared for a cut normal to the substrate axis Z', and a flat defining the direction of propagation is placed normal to the wafer axis X' along a substrate edge in the positive X' direction.

FIGS. 3A–3D illustrates SAW velocity, PFA $\Phi$, electromechanical coupling $k^2$ and temperature coefficient versus Euler angle $\psi$ for some values of angle $\theta$ and for $\phi=0°$. Velocity, $\Phi$, $k^2$ and temperature coefficient versus $\psi$ for various values of $\theta$. By way of example, these same parameters are illustrated versus $\psi$ for $\theta=145°$ in FIGS. 4A–4D for various values of $\phi$.

Again with reference to FIG. 1, and by way of example, one preferred embodiment of the present invention includes the SAW device 10 containing the langasite substrate 12, and IDT's 16, 18 and reflecting electrodes 24, 26. As earlier described, the axis Z' is normal to the substrate surface 14, the axis X' is normal to electrodes 20, 22, and the Y' axis is parallel to the electrodes 20, 22. These axes X', Y' and Z' are defined with respect to crystal axes as follows: $\phi=-15°$ to $10°$; $\theta=120°$ to $165°$, $\psi=20°$ to $45°$, where $\phi$, $\theta$, $\psi$ are the Euler angles.

With reference again to FIG. 2, $\phi$ is the angle between crystal axis X and auxiliary axis X", which is the axis of rotation of the plane XY (up to required orientation of the substrate surface).

$\theta$ is the angle between axis Z and the normal Z' to the substrate surface 14.

$\psi$ is the angle between axis X" and axis X', X' is perpendicular to electrodes of IDT's 20, 22.

Advantages of the device 10 as compared to earlier proposed cuts for langasite are realized. By way of example, SAW propagation parameters on langasite with orientation $(90°, 10°, 0°)$ would be as follows: temperature coefficient=12 ppm/° C., $k^2=0.26\%$, $\Phi=-5.7°$.

As illustrated again with reference to FIGS. 3 and 4 for the present invention, based on a langasite cut for the Euler angles within chosen limits $15°\leq\phi\leq+10°$, $120°\leq\theta\leq165°$, $20°\leq\psi\leq45°$, the temperature coefficient does not exceed 10 ppm/° C.; and for orientation $(0°, 135°, 24°)$, it is close to zero.

As a consequence, the temperature stability is improved as compared to the prior works completed on langasite.

Again with reference to FIGS. 3A–3D and 4A–4D, it is shown that in the present invention, the PFA, $\Phi$ is less than 5° and the electromechanical coupling coefficient is more than 0.2% with the maximum value 0.45%. Consequently for the orientations of the present invention, the electromechanical coupling coefficient $k^2$ is more than twice, and for some cases up to four times, that of earlier devices on ST-Quartz. There are several selections of orientations for which the PFA is substantially zero and the diffraction parameter γ is near the optimal value of −1. Additionally, the TCD in this range of orientations is at or near zero.

While specific embodiments of the invention have been described in detail herein above, it is to be understood that various modifications may be made from the specific details described herein without departing from the spirit and scope of the invention as set forth in the appended claims.

Having now described the invention, the construction, the operation and use of preferred embodiments thereof, and the advantageous new and useful results obtained thereby, the new and useful constructions, methods of use and reasonable mechanical equivalents thereof obvious to those skilled in the art, are set forth in the appended claims.

What is claimed is:

1. A surface acoustic wave (SAW) device comprising:
    a langasite substrate having a SAW propagation surface;
    input and output interdigital transducers having electrodes on the surface for launching and detecting surface acoustic waves, wherein a surface wave direction of propagation is along an X' axis, the substrate further having an Z' axis normal to the surface, and a Y' axis along the surface and perpendicular to the X' axis, the langasite substrate further having a crystal orientation defined by crystal axes X, Y, and Z, the relative orientation of device axes X', Y', and Z' being defined by Euler angles φ, θ, and ψ; and
    wherein φ has a value ranging from −15° to 10°, θ has a value ranging from 120° to 165°, and ψ has a value ranging from 20° to 45°.

2. The device according to claim 1, wherein the Euler angle φ is within the range of −1.8°±5°, θ is within the range of 135.6°±5°, and ψ is within the range of 24.1°±5°.

3. The device according to claim 1, wherein the Euler angle φ is proximate 0°, θ is within the range of 135°±10°, and ψ is within the range of 30°±10°.

4. A surface acoustic wave device comprising:
    a substrate having a substantially planar surface for propagating surface acoustic waves thereon, the substrate formed from a single lanthanum gallium silicate (langasite) crystal cut for providing a crystal orientation for forming the surface defined by Euler angles having a range of −10°≦φ≦10°, 120°≦θ≦165°, and 20°≦ψ≦45°; and
    interdigitized electrodes affixed to the surface.

5. The device according to claim 4, wherein the electrodes have an orientation generally perpendicular to a direction of wave propagation generally defined by the crystal orientation Euler angle ψ.

6. A surface acoustic wave device substrate formed from a langasite single crystal, the substrate comprising:
    a planar surface for an interdigital transducer having a plurality of electrodes, the interdigital transducers for launching and detecting surface acoustic waves propagating generally perpendicular to the electrodes; and
    a crystal orientation cut for forming the surface, the crystal orientation defined by Euler angles φ, θ, and ψ, wherein φ has a value ranging from approximately −10° to approximately 10°, θ has a value ranging from approximately 120° to approximately 165°, and ψ has a value ranging from approximately 20° to approximately 45°.

7. A method for forming a surface acoustic wave device comprising the steps of:
    providing a lanthanum gallium silicate (langasite) single crystal;
    orientating the crystal for cutting a planar surface, the crystal orientating defined by Euler angles φ, 74 , and ψ;
    cutting the crystal for forming the planar surface, the cut defined by the Euler angles, wherein φ has a value ranging from approximately −15° to approximately 10°, θ has a value ranging from approximately 120° to approximately 165°, and ψ has a value ranging from approximately 20° to approximately 45°; and
    affixing an interdigitized transducer on the surface for propagating and detecting surface acoustic waves propagating in a direction generally along an axis of propagation defined relative to the crystal orientation angle ψ.

8. The method according to claim 7, wherein the transducer affixing step further comprises the step of orientating electrodes of the transducer generally perpendicular to the axis of propagation.

9. The method according to claim 7, wherein the Euler angles comprise Φ having a value proximate 0°, θ having a value ranging from approximately 125° to approximately 145°, and ψ having a value ranging from approximately 14° to approximately 34°.

10. A method for forming a surface acoustic wave device substrate comprising the steps of:
    providing a lanthanum gallium silicate (langasite) single crystal;
    orientating the crystal for cutting a planar surface, the crystal orientating defined by Euler angles φ, θ, and ψ; and
    cutting the crystal for forming the planar surface, the cut defined by the Euler angles, wherein φ has a value ranging from approximately −15° to approximately 10°, θ has a value ranging from approximately 120° to approximately 165°, and ψ has a value ranging from approximately 20° to approximately 45° for affixing interdigitized transducer electrodes on the surface for propagating and detecting surface acoustic waves in a direction generally along an axis of propagation defined relative to the crystal orientation angle ψ.

11. The method according to claim 10, further comprising the step of affixing interdigitized transducer electrodes on the surface for propagating and detecting surface acoustic waves in a direction generally along an axis of propagation defined relative to the crystal orientation angle ψ, and orienting the electrodes generally perpendicular to the axis of propagation.

12. The method according to claim 10, wherein the Euler angles comprise φ having a value proximate 0°, θ having a value ranging from approximately 125° to approximately 145°, and ψ having a value ranging from approximately 14° to approximately 34°.

13. A method for generally improving temperature stability, lowering power flow angle, and reducing diffraction in a surface acoustic wave device, the method comprising the steps of:
    providing a lanthanum gallium silicate (langasite) single crystal;
    orientating the crystal for cutting a planar surface, the crystal orientating defined by Euler angles φ, θ, and ψ;
    cutting the crystal for forming the planar surface, the cut defined by the Euler angles, wherein φ has a value ranging from approximately −15° to approximately 10°, θ has a value ranging from approximately 120° to approximately 165°, and ψ has a value ranging from approximately 20° to approximately 45°; and affixing interdigitized transducers on the surface for propagating and detecting surface acoustic waves in a direction generally along an axis of propagation defined relative to the crystal orientation angle ψ, and wherein electrodes of the transducers are generally perpendicular to the axis of propagation.

* * * * *

UNITED STATES PATENT AND TRADEMARK OFFICE
CERTIFICATE OF CORRECTION

PATENT NO. : 5,917,265
DATED : June 29, 1999
INVENTOR(S) : Natalya F. Naumenko and Victor S. Orlov It is certified that error appears in the above-identified patent and that said Letters Patent is hereby corrected as shown below:

Column 6, Line 6: Please strike the number "74" and insert --$\theta$--.

Signed and Sealed this

Twenty-first Day of December, 1999

Attest:

Q. TODD DICKINSON

*Attesting Officer*  *Acting Commissioner of Patents and Trademarks*